United States Patent [19]
Sichmann

[11] Patent Number: 5,863,399
[45] Date of Patent: Jan. 26, 1999

[54] DEVICE FOR CATHODE SPUTTERING

[75] Inventor: Eggo Sichmann, Geinhausen, Germany

[73] Assignee: Singulus Technologies GmbH, Alzenau, Germany

[21] Appl. No.: 833,985

[22] Filed: Apr. 11, 1997

[30] Foreign Application Priority Data

Apr. 13, 1996 [DE] Germany ........................ 196 14 595 .3
Apr. 13, 1996 [DE] Germany ........................ 196 14 599 .6

[51] Int. Cl.[6] ................................................. C23C 14/34
[52] U.S. Cl. ................................ 204/298.19; 204/298.09; 204/298.11; 204/298.12; 204/298.14; 204/298.17; 204/298.18
[58] Field of Search .................... 204/298.09, 298.11, 204/298.12, 298.14, 298.16, 298.17, 298.18, 298.19

[56] References Cited

U.S. PATENT DOCUMENTS

| | | | |
|---|---|---|---|
| 4,060,470 | 11/1977 | Clarke | 204/192.12 |
| 4,100,055 | 7/1978 | Rainey | 204/298.18 |
| 4,407,708 | 10/1983 | Landau | 204/298.19 |
| 4,957,605 | 9/1990 | Hurwitt et al. | 204/298.18 |
| 5,688,381 | 11/1997 | Gruenenfelder et al. | 204/298.18 |

FOREIGN PATENT DOCUMENTS

| | | |
|---|---|---|
| E 29 623 B | 3/1988 | Austria . |
| 0 095 211 | 11/1983 | European Pat. Off. ........ 204/298.19 |
| 0 127 272 A2 | 12/1984 | European Pat. Off. . |
| 0 227 438 A2 | 7/1987 | European Pat. Off. . |
| 0 227 438 A3 | 7/1987 | European Pat. Off. . |
| 0 297 779 A2 | 1/1989 | European Pat. Off. . |
| 0 334 564 A2 | 9/1989 | European Pat. Off. . |
| 0 461 525 A1 | 12/1991 | European Pat. Off. . |
| 0 606 097 A1 | 7/1994 | European Pat. Off. . |
| 0 676 791 A1 | 10/1995 | European Pat. Off. . |
| 2 535 109 | 4/1984 | France . |
| 2824289 C2 | 12/1978 | Germany . |
| 43 15 023 | 11/1994 | Germany ...................... 204/298.16 |
| 646 012 | 10/1984 | Switzerland . |

*Primary Examiner*—Nam Nguyen
*Assistant Examiner*—Rodney G. McDonald
*Attorney, Agent, or Firm*—Pillsbury Madison & Sutro

[57] ABSTRACT

A device for cathode sputtering for producing coatings on a substrate 27 by means of a sputtering cathode, which device can be introduced into a vacuum chamber and has magnets or ring magnets 9, 13 concentrically arranged in respect to the center axis 44 of the sputtering cathode, pole shoes 14 and a target 8. The target has a front surface 41 with at least a surface portion which is inclined with respect to the back surface 40 of the target. In the area of the back surface 40 of the target at least one second, outer ring magnet 42 with a larger diameter is provided in addition to the inner ring magnets 9, 13.

36 Claims, 2 Drawing Sheets

DEVICE FOR CATHODE SPUTTERING

BACKGROUND OF THE INVENTION

The present invention relates to a device for cathode sputtering for producing coatings on a substrate by means of a sputtering cathode, which can be introduced into a vacuum chamber and has magnets or ring magnets concentrically arranged in respect to the center axis of the sputtering cathode, pole shoes and a target, and whose surface extends at least partially inclined in respect to the back of the target.

A device for cathode sputtering for static coating of disk-shaped substrates by means of a plasma in a vacuum chamber with at least one opening, which can be closed from the outside by placing a sputtering cathode on it, is disclosed in DE 43 15 023 A1. An elastic vacuum seal ring and an annular cathode are provided between the cathode and the chamber wall, which radially enclose the openings from the outside, wherein the anode has a flat contact surface on its side facing in the direction of the cathode. The known sputtering cathode consist of a disk-shaped ferromagnetic yoke and a cooling plate. A disk-shaped insulator is inserted between these two. The target to be sputtered is situated in front of the cooling plate, while a ring magnet is inserted in a groove on the back of the cooling plate. A counter-magnetic field is generated by the ring magnet, which affects the path of the magnetic field lines. By means of this the path of the magnetic field lines is given an approximately collimated, or lens-shaped or convex form.

Further prior art is disclosed in DE-G-2824289, FR-2535109, EP-A-247779, EP-A-227438, EP-A-334564, US-A-4060470, EP-A-461525, EP-A-127272, EP-A-95211, CH-646012, EP-A-676791, and EP-A-606097.

BRIEF SUMMARY OF THE INVENTION

In contrast thereto, it is an object of the present invention to arrange the magnets in such a way, or to configure the magnetic field in such a way, that the target yield is improved.

In accordance with the invention the above and other objects attained in that in the area of the back of the target at least one second, outer ring magnet with a larger diameter is provided besides the first inner ring magnet. By employing two ring magnets it is possible to achieve an increase in the magnetic field and simultaneously in a defined area of the cathode the flattest possible surface path for the magnetic field lines in respect to the back of the target. An improved utilization of the target is assured by this.

To this end it is furthermore advantageous that the two ring magnets provided in the area of the back of the target are arranged on the same transverse plane, and that the inner ring magnet is provided in the area of the exterior circumference of the center mask or the center anode or a cooling finger, and the outer ring magnet in the edge area or in the area of the exterior circumference of the target.

In a further development of the invention it is advantageous that, besides the two inner ring magnets, a third ring magnet is provided. The third ring magnet surrounds the two ring magnets and adjoins a side or the bottom side of the yoke.

In accordance with a preferred embodiment of the invention, all ring magnets are mounted to be dynamically balanced in respect to the center axis of the target and the two inner ring magnets are provided in annular grooves situated in the cooling plate. The laterally disposed ring magnet generates the magnetic sputtering field which penetrates the target.

In accordance with a further feature of the invention, the outer ring magnet is optionally provided in the area of the pole shoe diameter between the yoke and the upper part of the pole shoe, and that the two inner ring magnets are located inside the exterior diameter or the exterior circumference of the target.

It is furthermore advantageous to have the outer ring magnet at a larger distance from the back of the target than the two inner ring magnets, and that a fourth ring magnet is provided which encloses the exterior circumference of the target. By means of the installation of the additional double ring magnets, which can also be placed very close to the back of the target, the widest possible erosion ditch is created by the horizontally extending magnetic field lines, since the electrons are not being focused on narrow areas or on an annular groove. For this reason it is advantageous that a large horizontal component of the magnetic field is achieved, and a very short distance from the back of the target is achieved by installing the double ring magnets in the rear wall of the cooling plate. The target configuration and the pole shoe design are also of particular importance.

To this end it is advantageous that the thickness $D_1$, of the target in its outer edge area is greater than the thickness $D_2$ in the inner edge area of the target, and that an inclined extending target surface and a target surface extending parallel with the back of the target are provided between the inner and the outer edge areas of the target. It is furthermore advantageous that the inclined extending target surface is provided in the inner edge area of the target, the parallel extending target surface is provided in the outer edge area of the target, and the inclined extending target surface and the parallel extending target surface are provided between inner and an outer target elements protruding in the form of sharp edges. The thickness $D_1$, of the target 8 corresponds to the vertical distance between the back 40 and the lower extremity 57 of target 8.

In accordance with a further development of the device of the invention, a further option consists in that a ring-shaped flange element, extending concentrically with the center axis, is provided at the inner edge area of the target, which is clamped between the surface of the cooling plate and the flange element of a fastening device, which is fixedly or releasably connected with the target. Because of the advantageous design of the target with a flange-shaped element in connection with a cooling finger, which can be screwed in or fixed in place by means of screw elements, the target no longer needs to be bonded on, but can be easily replaced at any time as required.

Depending on the use, it is also possible that at least one ring magnet is provided in the area of the exterior circumference of the target below the ring magnets provided at the back of the target or in its area.

To this end is furthermore advantageous that the ring magnet provided in the area of the exterior circumference of the target is provided slightly above or below the lower limit of the target surface, and that the ring magnet provided in the area of the exterior circumference of the target is provided slightly outside the lower limit of the target surface which extends parallel with the target back of the target.

In a further development of the invention, it is advantageous that the ring magnet provided in the area of the exterior circumference of the target terminates slightly below or outside of the lower limit of the pole shoes, that the ring magnet is disposed concentrically in respect to the center axis of the target and that the lower end of the pole shoe is at a greater distance from the back of the target than the lower end of the target or the target surface.

In a further development of the invention, it is advantageous that the pole shoe has a lower part provided with an annular space or a chamber. Preferably, two spaced apart flanges or bars are provided in the lower area of the pole shoe delimiting said annular space or chamber. According to the invention, it is further preferred that the annular space of the pole shoe's lower part houses an additional ring magnet. It is further preferred that the lower part of the pole shoe toward the exterior circumference of the pole shoes consists of a pole shoe element which tapers in the form of a truncated pyramid.

It is of special importance for the instant invention that the pole shoe element which tapers in the form of a truncated pyramid makes a transition into the flange element which is wider than the free-standing end of the pole shoe, and that the flange elements of the pole shoe extend parallel with the back of the target.

In connection with the embodiment and arrangement in accordance with the invention, it is advantageous that an angle (α) is formed between the front face of the end of the pole shoe and the inclined extending lateral wall of the pole shoe element which tapers in the form of a truncated pyramid, or cone, which angle has a value between 10° and 50°, and preferably between 25 and 45°.

It is furthermore advantageous that the surface or ring face of the pole shoe element lies on the same inclined extending plane as the surface or ring face of the point-shaped target element. An optimal design of the target is achieved because of the inclined extending arrangement of the target and the adjoining parallel extending target surface, in particular if a non-ferromagnetic metal target is employed as coating material, since because of the advantageous arrangement of the ring magnets, more material is sputtered off in the outer area of the target than in the inner area. This therefore provides an even use of the target.

BRIEF DESCRIPTION OF THE SEVERAL VIEWS OF THE DRAWING

Further advantages and details of the invention are described below and shown in the drawing figures, of which.

DETAILED DESCRIPTION OF THE INVENTION

Figure 1:
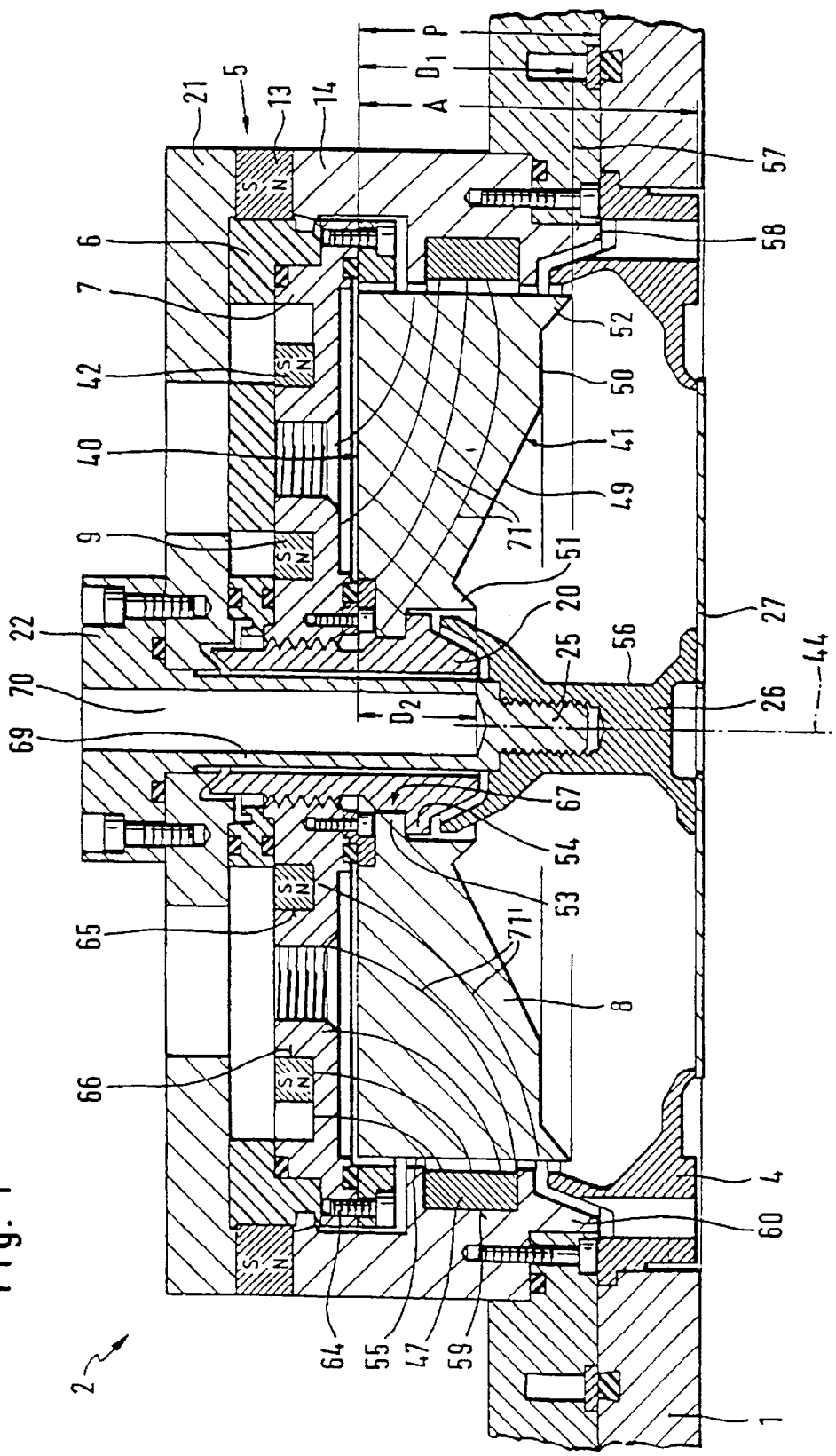
FIG. 1 is an elevational, cross-sectional view of an embodiment of the invention which includes a target with several concentrically arranged ring magnets.

A cathode sputtering device 2 of apparatus according to the invention for creating coatings on a substrate, for example a compact disk 27, is represented in FIG. 1. For performing the process, device 2 can be installed in an opening in wall 1 of a vacuum chamber of the apparatus. Device 2 includes a cathode composed of a disk-shaped ferromagnetic yoke 5 and a cooling plate 7. An insulator 6 is clamped between the yoke 5 and the cooling plate 7 and secured by means of threaded bolts.

A target 8 from which coating material is to be sputtered is arranged in front of the cooling plate 7. A ring-shaped, or annular, groove 66 and an annular groove 65 are formed in the back of the cooling plate 7. Groove 66 receives an outer ring magnet 42 and groove 65, located radially inwardly of groove 66, receives an inner ring magnet 9. Grooves 65 and 66, as well as magnets 9 and 42, are arranged concentrically with respect to the center axis 44 of the target 8. The yoke 5, the insulator 6 and the cooling plate 7 are secured by means of a screw, not shown in the drawings. In an advantageous manner the screw is insulated against the yoke by means of an insulator. A cable connected with a sputter current supply device can be connected with the screw.

A further ring magnet 13 arranged concentrically with respect to the center axis 44 is located in the area of the exterior circumference of the cooling plate 7 or the insulator 6. The magnet 13 is embodied as a ferromagnet and therefore constitutes the complete magnetic field enclosure.

A pole shoe 14, which concentrically surrounds the insulator 6, the cooling plate 7 and the target 8, adjoins the ring magnet 13.

Figure 2:
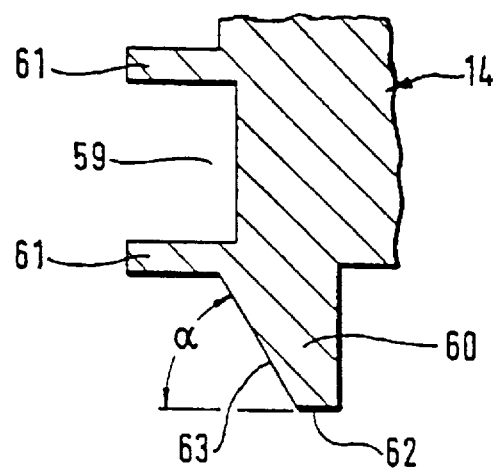
FIG. 2 is a cross-sectional detail view of a portion of a pole shoe constituting an element of the embodiment shown in FIG. 1.

The lower part of the pole shoe forms a pole shoe element 60 in the form of a truncated pyramid, or cone, tapering downwardly or in the direction toward the vacuum chamber. The lower portion of pole shoe 14 is shown in FIG. 2. The pole shoe element 60 includes a part in the form of a truncated cone which makes a transition into a radially inwardly directed ring-shaped flange element 61 which is wider than the free-standing lower end 62 of the pole shoe. The pole shoe 14 has a radially inwardly facing lateral wall 63 or front face which is a part of the pole shoe element 60 in the form of a truncated cone. Two annular flanges 61 disposed at a vertical distance from each other can be attached to the lower end of the pole shoe and form an annular chamber 59.

If a fourth ring magnet 47 is received concentrically with respect to the center axis 44, the annular flanges 61 may be omitted. An angle α, which can a value between 10° and 60°, or preferably between 20° and 50°, or most preferably between 25° and 45°, and which affects the course of the magnetic field lines in an advantageous manner, is formed between the front face of the end 62 of the pole shoe 14 and the inclined extending lateral wall 63 of the pole shoe element 60.

A bore 67 is located in the area of the center axis 44 of the sputtering cathode device 2. Bore 67 extends through the entire device and is used to receive a hollow screw 20 having a radially outwardly extending lower flange element 54. Hollow screw 20 is pushed or screwed in place so that its lower flange element 54 bears against an inwardly radially directed flange element 53 provided on the target 8.

With its yoke plate 21, the yoke 5 adjoins the hollow screw 20 without contacting hollow screw 20 by being spaced therefrom in the axial direction.

A cooling head, or finger, 69 is fastened on the back of the yoke 5 by means of a flange 22 and extends in the axial direction through the yoke plate 21 as well as through the hollow screw 20 up to the front of the target and does not contact the hollow screw 20. The flange 22 of the cooling finger 69 with the cylindrical element adjoining it forms a cylindrical bore 70 for receiving a tube, not shown in the drawings, which is connected to a cooling water line.

A center mask or center anode 26 is releasably connected by means of a screw 25 to the front or the lower end of the flange 22 of the cooling finger 69. The center anode 26 extends as far as the hollow center of the target 8 which is provided at the front of the target. The lower end of center anode 26 forms, together with an outer anode 4 or outer mask, an annular surface for masking the substrate 27.

As can be seen from FIG. 1, the screw 20 has the flange element 54 which pushes the flange element 53 provided at the target 8 against the front of the cooling plate 7. In this way the otherwise customary bonding of the target can be omitted, and it can easily be replaced. It is furthermore possible to connect the target with the cooling flange by means of screws.

As can be seen from FIG. 1, the two ring magnets 9 and 42 provided on the back of the target are arranged in the same transverse plane. The inner ring magnet 9 is arranged in the area of the exterior circumference 56 of the center mask or center anode 26 or of the cooling finger 69 or closer toward the center axis 44 or in the area of the exterior circumference of the hollow-shaped screw 20 for receiving the cooling finger 69. The outer ring magnet 42 is situated in the edge area or in the area of the exterior circumference 55 of the target 8.

The ring magnet 13 is located slightly above the two ring magnets 9 and 42 and can be disposed on the yoke 5. The ring magnet 13 can be formed by numerous individual magnets arranged in a ring-shape.

Depending on the embodiment of the target, which can be embodied, for example, as an aluminum target or a gold target, the fourth ring magnet 47 can be provided in the area of the lower end of the exterior circumference of the target 8.

All ring magnets 9, 13, 42 and 47 are mounted to be dynamically balanced about the center axis 44 of the target 8. In an advantageous manner, the two inner ring magnets 9 and 42 are also located inside the exterior diameter or exterior circumference 55 of the target 8.

As can be seen from FIG. 1, the outer ring magnet 13 is at a greater vertical distance from the back of the target than are the two inner ring magnets 9 and 42.

If, for example, the target is embodied as an aluminum target, it is advantageous for the thickness $D_1$, of the target 8 at its exterior edge 55 to be greater than the thickness $D_2$ of the target 8 at its interior edge. By means of this the target 8 is given an inclined extending target surface portion 49 in accordance with FIG. 1, and an adjoining target surface portion 50 extending parallel with the back of the target, or perpendicular to axis 44.

If an aluminum target is used and two double ring magnets 9 and 42 are employed, the magnetic field is flattened at the back of the target, even with a very compact design (in this connection see the magnetic field lines 71 on the right-hand side of the target 8). If, for example, the two double magnets were omitted, the magnetic field lines 71', shown on the left-hand side of FIG. 1, would take a very unfavorable course, i.e. they would enter the yoke 5 almost vertically. On the right-hand side of FIG. 1, the field lines 71 take a convex or flattened or approximately parallel course in respect to the back of the target. This is caused in an advantageous manner by the two double ring magnets 9 and 42 provided at the back of the target, which aid in the amplification of the field lines. Such an arrangement of the ring magnets 9 and 42 is particularly suitable in connection with a non-ferromagnetic metal target, for example an aluminum target. A very compact design of the entire device is achieved because of the double embodiment of the two ring magnets and the danger of a short circuit is ruled out to a large degree. Thus the two ring or counter magnets 9 and 42 amplify the magnetic field lines so that they can take up the course shown on the right-hand side of FIG. 1.

As can be seen from FIG. 1, the distance A between the front face of the cooling plate 7 and the lower edge of the center mask and/or anode 26 is greater than the thickness $D_1$, of the target 8 or the distance P between the back 40 of the target 8 and the lower limit 58 of the narrow projecting pole shoe element 62.

A sharp edged target element 51 located in the center or in the area of the center axis 44 is set back in relation to the exterior sharp edged target element 52.

If, for example, a target with a low electron emission rate or a gold target is employed, it is advantageous if the magnetic field is amplified in the area of the target surface, because a gold target has considerably different sputtering properties than an aluminum target. The ring magnet 47 provided in the area of the exterior circumference of the target 8 and in the pole shoe 14 is situated in the area or slightly below the target surface 41 comprising the target surface portions 49 and 50 and is used for amplifying the magnetic field in the area of the target surface 41, so that with this arrangement, too, the magnetic field lines do not enter the yoke 5 vertically or approximately vertically. This relatively large magnet 47 lies in the direction of the main magnetic field and aids in the amplification of the magnetic flux. In this case the flanges or bars 61 of the pole shoe element 62 can be omitted. The broken line 72 indicates an alternative target surface showing a situation where the ring magnet 47 extends beyond said target surface 72.

Since a lesser electron emission occurs with gold sputtering, a clearly higher voltage of, for example, 2,000 V would be required without the relatively large ring magnet 47 in the vicinity of the target surface 41 in order to provide an output worth mentioning. By means of the advantageous provision of the ring magnet 47, the magnetic field can be amplified and the plasma impedance reduced.

The ring magnets 9, 13, 42 are all polarized the same, wherein North is directed downwardly, each in respect to the view of FIG. 1.

This application relates to subject matter disclosed in German Application numbers 196 14 595.3 filed Apr. 13, 1996 and 196 14 599.6, also filed Apr. 13, 1996 the disclosures of which are incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A device mountable on a vacuum chamber for cathode sputtering for producing a coating on a substrate (27) when the substrate is placed in a coating position relative to said device, said device comprising:

means defining a sputter cathode (5, 7, 21) having a center axis (44);

a plurality of magnets (9, 13, 42) concentrically arranged with respect to the center axis:

a pole shoe (14); and a target (8) constituting a source of sputtering material, said target having a back surface which faces away from the coating position and a front surface which faces toward the coating position and which has a first surface portion (41) that extends at an acute angle to a plane perpendicular to the center axis (44), wherein said plurality of magnets include an inner ring magnet (9), an outer ring magnet (42) and a third ring magnet (13), all disposed in a region facing said back surface of said target (8), each said ring magnet having a diameter, said outer ring magnet (42) having a larger diameter than said inner ring magnet, said third ring magnet (13) surrounding said inner and outer ring magnets (9,42) and said third ring magnet being located in alignment, in a direction parallel to the center axis (44), with said pole shoe, and further wherein said target has an exterior circumferential surface (55) and said magnets further include a four ring magnet (47) which surrounds the exterior circumferential surface of said target.

2. The device in accordance with claim 1, wherein said inner and outer ring magnets are centered on a common plane transverse to the center axis.

3. The device in accordance with claim 1, further comprising a center anode coaxial with the center axis and a cooling finger coaxial with the center axis, said center anode and said cooling finger each having an exterior circumferential surface, and wherein, said inner ring magnet is located in proximity to a cylindrical surface which contains the exterior circumferential surface of one of said center anode and cooling finger, and said outer ring magnet is located in proximity to a cylindrical surface which contains the exterior circumferential surface of said target.

4. The device in accordance with claims 3, wherein said inner and outer ring magnets are surrounded by the cylindrical surface which contains the exterior circumferential surface of said target.

5. The device in accordance with claim 1, further comprising a yoke enclosing said target, and wherein said third ring magnet adjoins said yoke.

6. The device in accordance with claim 5, wherein said pole shoe has an upper part and said third ring magnet is located in alignment with said pole shoe between said yoke and the upper part of said pole shoe.

7. The device in accordance with claim 1, wherein the back surface of said target lies in a back surface plane and said third ring magnet is disposed at a greater distance from the back surface plane than are said inner and outer ring magnets.

8. The device in accordance with claim 1, wherein said ring magnets are mounted to be dynamically balanced with respect to the center axis.

9. The device in accordance with claim 1, further comprising a cooling plate disposed adjacent said back surface of said target and provided with two annular grooves, and wherein each of said ring magnets is disposed in a respective one of said annular grooves.

10. The device in accordance with claim 1, wherein said target has an outer edge with a thickness dimension, $D_1$, parallel to the center axis, and an inner edge with a thickness dimension, $D_2$, parallel to the center axis, and $D_1$ is larger than $D_2$.

11. The device in accordance with claim 10, wherein said front surface of said target has a second surface portion extending parallel to said back surface, and said first and second surface portions extend between said inner edge and said outer edge of said target.

12. The device in accordance with claim 11, wherein said first surface portion is located in proximity to said inner edge and said second surface portion is located in proximity to said outer edge.

13. The device in accordance with claim 11, wherein said front surface of said target further has an outer projecting sharp edged portion (52) at said outer edge and an inner projecting sharp edged portion (51) at said inner edge, and further wherein said first and second surface portions are located between said inner and outer sharp edged portions.

14. The device in accordance with claim 1, further comprising a cooling plate (7) disposed adjacent said back surface of said target and a fastening device (20) having a flange element (54), and wherein said target has an inner edge delimiting a hollow center region and provided with a ring-shaped flange element (53) extending concentrically with the center axis and said ring-shaped flange element is clamped between said cooling plate and said flange element of said fastening device.

15. The device in accordance with claim 1, wherein: said front surface of said target faces downwardly; said target has an outer edge; and fourth ring magnet (47) is located adjacent said outer edge of said target at a location below said inner and outer ring magnets.

16. The device in accordance with claim 15, wherein the front surface of said target has a lower extremity (57), and said fourth ring magnet is located above or below the lower extremity.

17. The device in accordance with claim 15, wherein the front surface of said target has a lower extremity (57), and said fourth ring magnet is located a distance from the lower extremity.

18. The device in accordance with claim 15, wherein said pole shoe has a lower extremity and said fourth ring magnet extends to a location slightly below or outside of the lower extremity of said pole shoe.

19. The device in accordance with claim 15, wherein said fourth ring magnet is disposed concentrically with respect to the center axis.

20. The device in accordance with claim 1, wherein said pole shoe has a lower extremity which is spaced from said back surface of said target by a first distance and said front surface is spaced from said back surface of said target by a second distance which is smaller than the first distance.

21. The device in accordance with claim 1, wherein said pole shoe has a lower part provided with an annular space.

22. The device in accordance with claim 21 wherein the lower part of said pole shoe has two spaced apart flanges delimiting the annular space.

23. The device in accordance with claim 22, wherein said two spaced apart flanges extend parallel to the back surface of said target.

24. The device in accordance with claim 1, wherein said pole shoe has a lower part with a lower extremity, and said pole shoe further has an the exterior circumference, and said lower part is constituted by a pole shoe element which tapers toward the lower extremity and the exterior circumference in the form of a truncated cone.

25. The device in accordance with claim 24, wherein said pole shoe further has a flange element (61), said pole shoe is wider at the level of said flange element than at the level of the lower extremity, and said pole shoe element makes a transition into said flange element.

26. The device in accordance with claim 24, wherein said pole shoe element has an inclined lateral wall which forms an angle ($\alpha$) with the lower extremity of said pole shoe, the angle ($\alpha$) having a value between 10° and 50°.

27. The device in accordance with claim 26, wherein the angle ($\alpha$) has a value between 25° and 45°.

28. The device in accordance with claim 26, wherein: said target has an outer edge; said front surface of said target further has an outer projecting sharp edged portion (52) at said outer edge; and said outer projecting sharp edged portion has a surface which is parallel to the inclined lateral wall of said pole shoe element.

29. A device mountable on a vacuum chamber for cathode sputtering for producing a coating on a substrate (27) when the substrate is placed in a coating position relative to said device, said device comprising:

means defining a sputtering cathode having a center axis (44);

a plurality of magnets concentrically arranged with respect to the center axis;

a pole shoe (14) having a lower part provided with two spaced-apart flanges delimiting an annular space; and a target (8) constituting a source of sputtering material, said target having a back surface which faces away from the coating position and a front surface which faces toward the coating position and which has a first surface portion that extends at an acute angle to a plane perpendicular to the center axis.

30. The device in accordance with claim 29, wherein said two spaced apart flanges extend parallel to the back surface of said target.

31. The device in accordance with claim 29, wherein said pole shoe lower part has a lower extremity, and said pole shoe further has an exterior circumference, and said lower part is constituted by a pole shoe element which tapers toward the lower extremity and the exterior circumference in the form of a truncated cone.

32. The device in accordance with claim 31, wherein said pole shoe further has a flange element (61), said pole shoe is wider at the level of said flange element than at the level of the lower extremity, and said pole shoe element makes a transition into said flange element.

33. The device in accordance with claim 31, wherein said pole shoe element has an inclined lateral wall which forms an angle ($\alpha$) with the lower extremity of said pole shoe, the angle ($\alpha$) having a value between 10° and 50°.

34. The device in accordance with claim 33, wherein the angle ($\alpha$) has a value between 25° and 45°.

35. The device in accordance with claim 33, wherein: said target has an outer edge; said front surface of said target further has an outer projecting sharp edged portion (52) at said outer edge; and said outer projecting sharp edged portion has a surface which is parallel to the inclined lateral wall of said pole shoe element.

36. The device in accordance with claim 29, wherein an additional ring magnet (47) is located in said annular space (53).

* * * * *